United States Patent
Choi et al.

(10) Patent No.: US 6,329,236 B1
(45) Date of Patent: Dec. 11, 2001

(54) METHOD FOR FABRICATING RESISTIVE LOAD STATIC RANDOM ACCESS MEMORY DEVICE

(75) Inventors: Ik-Soo Choi; Byoung-Ju Kang, both of Kyoungki-Do (KR)

(73) Assignee: Hyundai Electronics Industries Co., Ltd. (KR)

(*) Notice: Subject to any disclaimer, the term of this patent is extended or adjusted under 35 U.S.C. 154(b) by 0 days.

(21) Appl. No.: 09/610,119

(22) Filed: Jun. 30, 2000

(30) Foreign Application Priority Data

Jun. 30, 1999 (KR) .................................. 99-25835

(51) Int. Cl.[7] .................. H01L 21/8234; H01L 21/8244
(52) U.S. Cl. ............................ 438/238; 438/329
(58) Field of Search ................... 438/190, 238, 438/329, 330, 322, 381, 382, 383, 384, 385, 570

(56) References Cited

U.S. PATENT DOCUMENTS

| | | | |
|---|---|---|---|
| 5,232,865 | * 8/1993 | Manning et al. | 438/282 |
| 5,330,930 | 7/1994 | Chi . | |
| 5,444,653 | 8/1995 | Nagasawa et al. | 365/149 |
| 5,532,178 | 7/1996 | Liaw et al. . | |
| 5,607,879 | 3/1997 | Wuu et al. . | |
| 5,610,099 | * 3/1997 | Stevens et al. | 438/190 |
| 5,661,340 | 8/1997 | Ema et al. | 257/680 |
| 5,665,629 | * 9/1997 | Chen et al. | 438/238 |
| 5,728,615 | 3/1998 | Cheng et al. | 438/238 |
| 5,754,390 | 5/1998 | Sandhu et al. | 361/321.4 |
| 5,837,581 | 11/1998 | Cheng | 438/255 |
| 5,837,592 | * 11/1998 | Chang et al. | 438/382 |
| 5,960,282 | 9/1999 | Chuang | 438/255 |
| 5,981,333 | 11/1999 | Parekh et al. | 438/253 |
| 5,981,337 | 11/1999 | Chuang | 438/253 |
| 5,981,351 | 11/1999 | Nam et al. | 438/398 |
| 5,989,952 | 11/1999 | Jen et al. | 438/253 |
| 5,994,180 | 11/1999 | Uchida | 438/238 |
| 6,010,931 | 1/2000 | Sun et al. | 438/240 |
| 6,010,944 | 1/2000 | Huang et al. | 438/398 |
| 6,027,967 | 2/2000 | Parekh et al. | 438/254 |

FOREIGN PATENT DOCUMENTS

| | | | |
|---|---|---|---|
| 2-137311 | 5/1990 | (JP) | H01G/9/05 |
| 2-208960 | 8/1990 | (JP) | H01L/27/04 |
| 3-112116 | 5/1991 | (JP) | H01G/9/02 |
| 3-231417 | 10/1991 | (JP) | H01G/9/24 |
| 05267610 | 10/1993 | (JP) | H01L/27/108 |
| 06163850 | 10/1994 | (JP) | H01L/27/108 |
| 09289295 | 11/1997 | (JP) | H01L/27/108 |
| 11150043 | 6/1999 | (JP) | H01G/9/155 |
| 11195752 | 7/1999 | (JP) | H01L/27/04 |
| 111267171 | 10/1999 | (JP) | A61H/23/00 |

* cited by examiner

Primary Examiner—David Nelms
Assistant Examiner—David Nhu
(74) Attorney, Agent, or Firm—Blakely Sokoloff Taylor & Zafman

(57) ABSTRACT

A method for fabricating a resistive load static random access memory (SRAM) capable of providing a high resistive load without local resistance variation, includes a step of forming an isolated layer on a semiconductor substrate having driver and access transistors provided thereto, a step of selectively etching said isolated layer to provide a butting contact region, a step of forming a doped polysilicon layer on a resulting structure, a step of selectively counter-doping said doped polysilicon layer, and a step of patterning said doped polysilicon layer to provide a power supply line, a butting contact and a high load resistor.

7 Claims, 5 Drawing Sheets

METHOD FOR FABRICATING RESISTIVE LOAD STATIC RANDOM ACCESS MEMORY DEVICE

FIELD OF THE INVENTION

This invention relates to a semiconductor memory device; and, more particularly, to a method for fabricating a resistive load SRAM, which is capable of providing a high resistive load without local resistance variation.

DESCRIPTION OF THE PRIOR ART

There are two types of semiconductor memories: non-volatile and volatile, and there are two types of volatile random access memory (RAM): static and dynamic. The dynamic RAM (DRAM) is widely used as a main memory and the static RAM (SRAM) is usually used as cache memory.

As is well known, memory cells contained in a SRAM memory arrays are arranged in rows and columns in a form of matrix. Currently, there are several types of memory cells, such as a six transistor memory cell, four transistor memory cell with resistive load and four transistor memory cell with TFT-load, and the like.

Referring to FIGS. 1A to 1C, there are illustrated schematic diagrams showing sequential steps of fabricating a conventional resistive load SRAM.

As shown in FIG. 1A, a device isolation layer 10 is formed on a substrate 16, and then a step for providing driver and access transistors is processed. Thereafter, an oxide layer 12 is deposited on the substrate 16 for isolation, and a butting contact (or node contact) region 13 is then provided by selectively etching the oxide layer 12. A reference number 11 illustrates a doped polysilicon layer, which composes gates of the driver and the access transistors.

Referring to FIG. 1B, an undoped polysilicon layer 14 is deposited on a resulting structure having the butting contact region 13 to a thickness of about 800 Å. Then, arsenic ions (As) are inserted into the undoped polysilicon layer 14 through the use of blanket ion implantation in order for the layer 14 to have around tens of gigaohm (GΩ) resistance.

Referring to FIG. 1C, a photoresist pattern 15 covering a region for high load resistor is then formed on the polysilicon layer 14. By using the photoresit pattern 15 as an ion implantation mask, $V_{cc}$ ion implantation is performed to reduce the resistance of a region of the polysilicon layer 14 for $V_{cc}$ line and butting contact region. Then, the polysilicon layer 14 is patternized to provide $V_{cc}$ line, butting contact and high load resistor.

At this time, when a blanket ion implantation is processed for the undoped polysilicon layer to have high resistance after an undoped polysilicon layer is deposited, a selective ion implantation is performed to reduce resistance of a region for $V_{cc}$ line and butting contact.

However, when the masking process for butting contact is not well aligned, the polysilicon layer 14 has locally different resistance.

FIG. 2 illustrates a scanning electron microscope (SEM) picture showing butting contact. As shown, since the butting contact is provided as a pair, when the masking process for the butting contact is not aligned, two bottom portions A and B (shown in FIG. 1A) of the butting contact region have different width. In this case, the thickness C and D (shown in FIG. 1B) of the polysilicon layer 14 at the two bottom portions of butting contact region 13 are different and thus the polysilicon layer 14 has locally different resistance after the $V_{cc}$ ion implantation. It is very difficult, if not impossible, to solve above mentioned resistance difference with improvement of masking process for butting contact.

SUMMARY OF THE INVENTION

It is, therefore, an object of the present invention to provide a method for fabricating a resistive load SRAM, which is capable of providing a high resistive load without local resistance variation.

In accordance with an as aspect of the present invention, it is provided a method for fabricating a resistive load static random access memory (SRAM), comprising the steps of: a) forming an isolated layer on a semiconductor substrate having driver and access transistors provided thereto; b) selectively etching said isolated layer to provide a butting contact region; c) forming a doped polysilicon layer on a resulting structure; d) selectively counter-doping said doped polysilicon layer; and e) patterning said doped polysilicon layer to provide a power supply line, a butting contact and a high load resistor.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
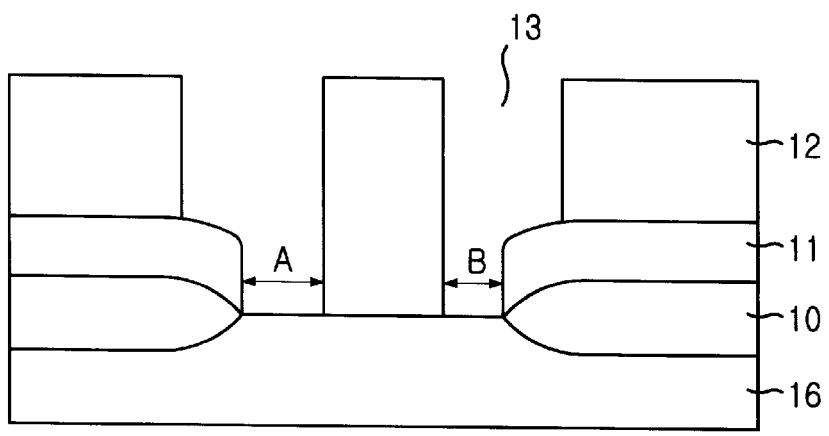
FIGS. 1A to 1C are schematic diagrams illustrating sequential steps of fabricating a conventional resistive load SRAM.
Figure 1B:
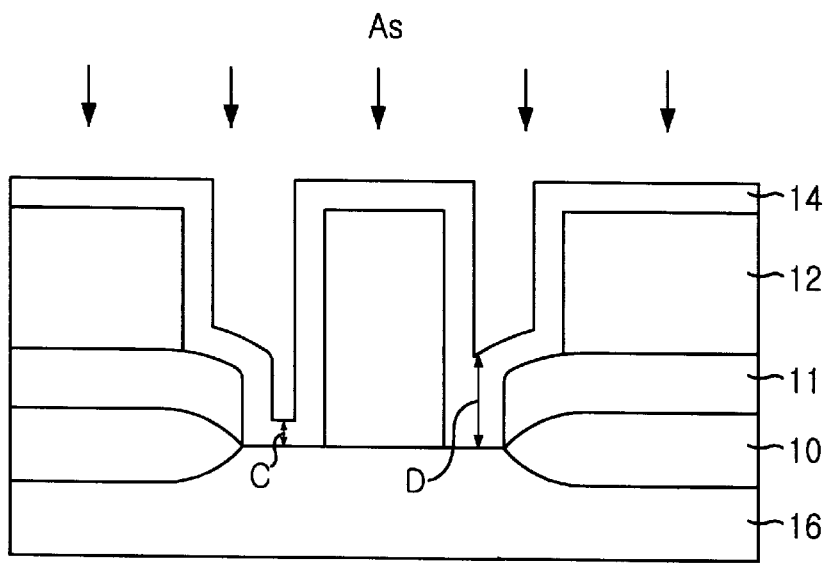
Figure 1C:
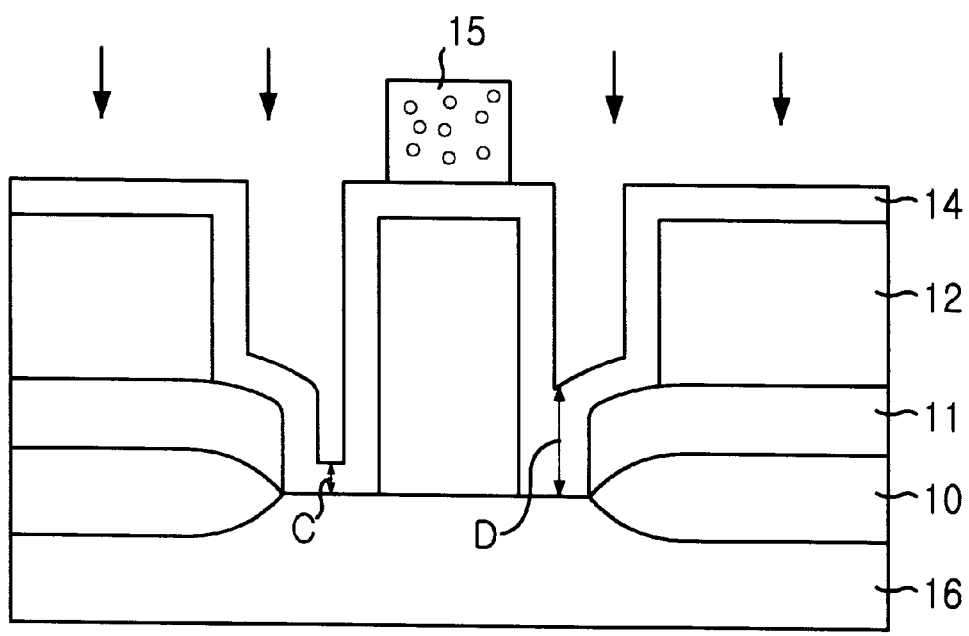
Figure 2:
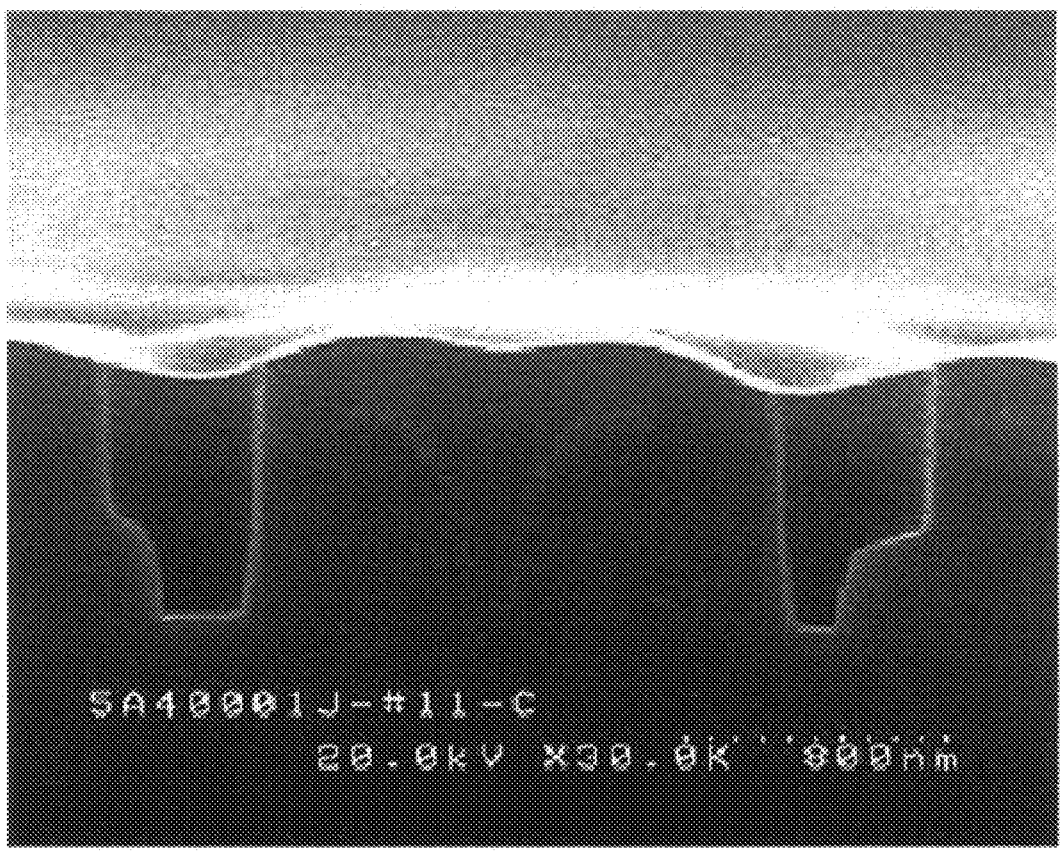
FIG. 2 illustrates a scanning electron microscope (SEM) picture showing butting contact.
Figure 3A:
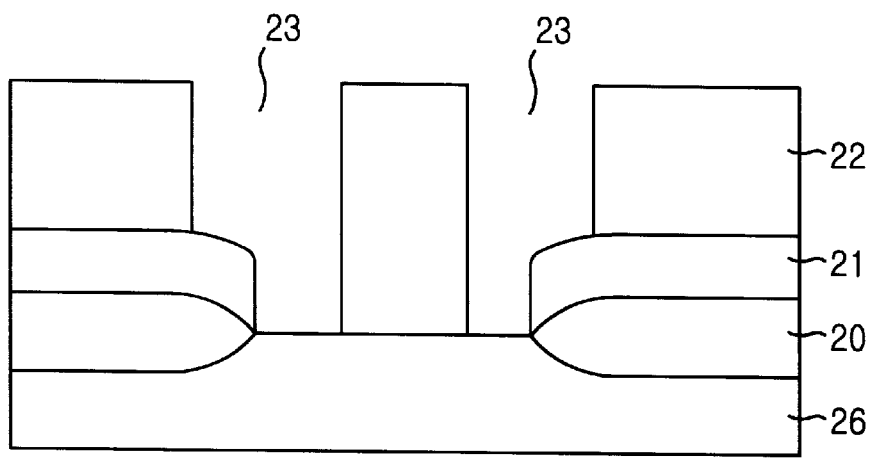
FIGS. 3A to 3C are schematic diagrams illustrating sequential steps of fabricating a resistive load SRAM in accordance with an embodiment of the present invention.
Figure 3B:
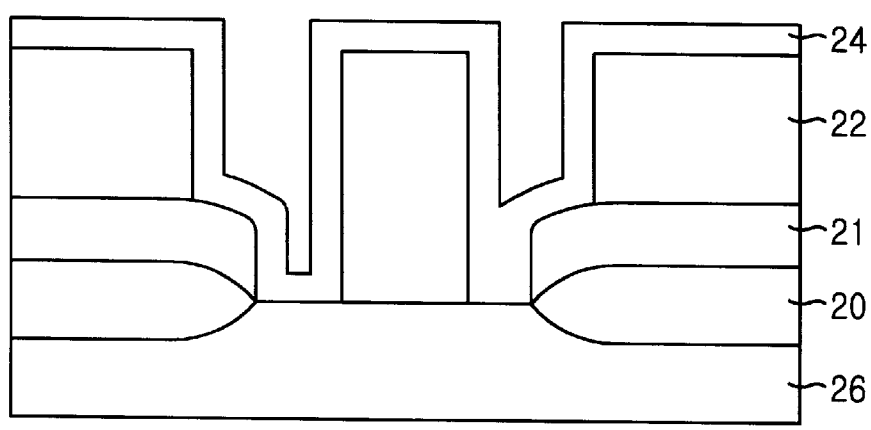
Figure 3C:
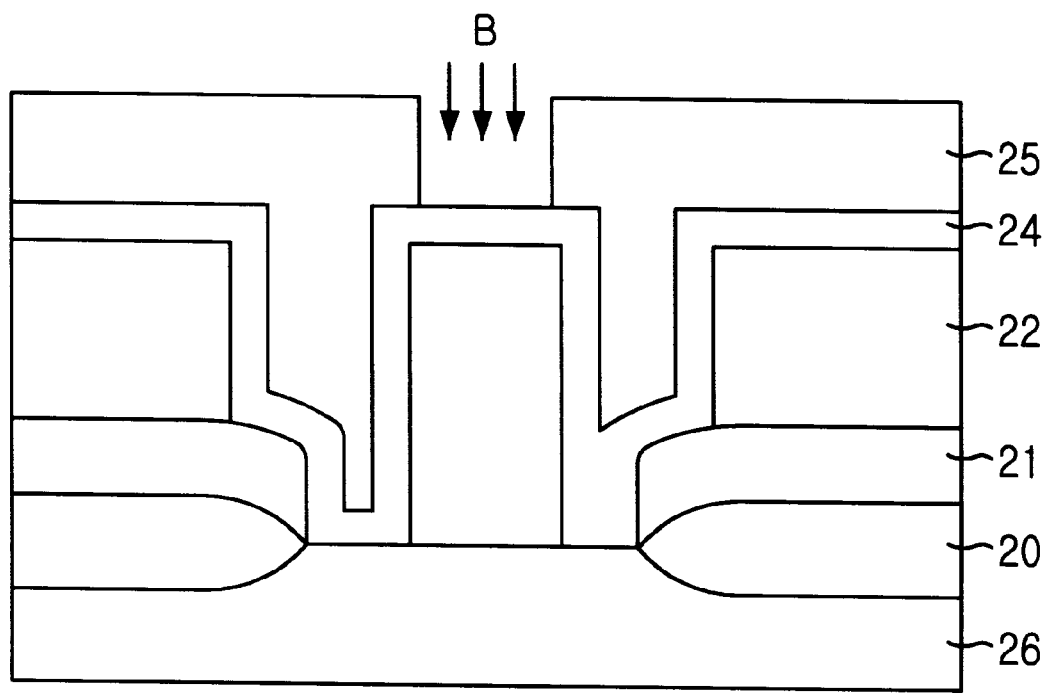

FIGS. 3A to 3C show schematic diagrams illustrating sequential steps of fabricating a resistive load SRAM in accordance with an embodiment of the present invention.

Referring to FIG. 3A, a device isolation layer 20 is formed on a substrate 26, and then a step for providing driver and access transistors is processed. Thereafter, an oxide layer 22 is deposited on the substrate 26 for isolation, and a butting contact region 23 is then provided by selectively etching the oxide layer 22. A reference number 21 illustrates a doped polysilicon layer, which composes gates of the driver and the access transistors.

Referring to FIG. 3B, a doped polysilicon layer 24 is deposited about 800 Å on a structure, which includes the substrate 26, the oxide layer 22, and the butting contact region 23. In order to provide low resistance of around tens of ohm (Ω) that is a value required for $V_{cc}$ line and butting contact, a negative source, e.g., $P_{31}$, is used as a dopant to the polysilicon. More specifically, the negative dopant is doped to the polysilicon with around 500 to 1500 Å thick under a deposition temperature of 500 to 800 °C. and a deposition pressure of 100 to 500 mTorr, by using $SiH_4$ and $N_2$ gases as a deposition gas.

Referring to FIG. 3C, a photoresist pattern 25 exposing a region for the high load resistor is then formed on the doped polysilicon layer 24 through the use of masking process. at this time, in case where a negative photoresist pattern is used, conventional $V_{cc}$ ion implantation masking can be used. Thereafter, a counter-doping is processed with a positive source such as Boron or Indium, to provide high resistance to the high load resistor region exposed by the photoresist pattern 25. For this counter-doping, the ion implantation or plasma doping technique can be used. By adjusting the amount of the positive dopant, the high load resistor region can have tens of gigaohm (GΩ) resistance. Then, the doped polysilicon layer 24 is patternized to provide $V_{cc}$ line, butting contact and high load resistor.

In accordance with the present invention, a doped polysilicon layer is deposited to get a constant and stable resistance for the butting contact and $V_{cc}$ line, and then a selective counter-doping process is performed to increase resistance for high load resistor region. Thus, a local resistance variation of the region for the butting contact and $V_{cc}$ line can be prevented even when the masking process for butting contact is not aligned.

In accordance with the preferred embodiment of the present invention, after a polysilicon layer doped with a negative source is deposited, a positive source is counter-doped to a region for the high load resistor. However, it is possible to use dopant reversibly.

While the present invention has been described with respect to certain preferred embodiments only, other modifications and variations may be made without departing from the spirit and scope of the present invention as set forth in the following claims.

What is claimed is:

1. A method for fabricating a resistive load static random access memory (SRAM), comprising the steps of:
   a) forming an isolated layer on a semiconductor substrate having driver and access transistors provided thereto;
   b) selectively etching said isolated layer to provide a butting contact region;
   c) forming a doped polysilicon layer on a resulting structure;
   d) selectively counter-doping said doped polysilicon layer; and
   e) patterning said doped polysilicon layer to provide a power supply line, a butting contact and a high load resistor.

2. The method as recited in claim 1, wherein dopant for the polysilicon layer at the step c) is a negative source, and dopant for the counter-doping at the step d) is a positive source.

3. The method as recited in claim 2, wherein the negative source is phosphrous (P) ions and said positive source is boron (B) or indium (In) ions.

4. The method as recited in claim 2, wherein the counter-doping at the step d) is performed by using an ion implantation or a plasma doping method.

5. The method as recited in claim 1, wherein the doped polysilicon layer is 500–1500 Å thick.

6. The method as recited in claim 2, wherein the negative source dopant is doped by using $SiH_4$ and $N_2$ gases as a deposition gas.

7. The SRAM fabrication method as recited in claim 6, wherein said negative source dopant is doped under a deposition temperature of 500 to 800° C. and a deposition pressure of 100 to 500 mTorr.

* * * * *